United States Patent [19]

Oh et al.

[11] Patent Number: 5,783,023
[45] Date of Patent: Jul. 21, 1998

[54] GAS INJECTOR FOR USE IN SEMICONDUCTOR ETCHING PROCESS

[75] Inventors: Jae-young Oh; Suk-yong Jung; Han-sung Kim; Jin-ho Park, all of Yongin-gun, Rep. of Korea

[73] Assignee: Samsung Electronics Co., Ltd., Kyungki-do, Rep. of Korea

[21] Appl. No.: 716,775

[22] Filed: Sep. 24, 1996

[30] Foreign Application Priority Data

Oct. 9, 1995 [KR] Rep. of Korea ............... 95-34557

[51] Int. Cl.$^6$ ............................................. H05H 1/00
[52] U.S. Cl. .................. 156/345; 118/715; 118/723 E; 118/723 R; 204/298.07; 204/298.33
[58] Field of Search ............... 156/345; 118/715, 118/723 E, 723 R; 204/298.33, 298.07

[56] References Cited

U.S. PATENT DOCUMENTS 4,612,077  9/1986  Tracy et al. ............... 156/345
5,422,139  6/1995  Fischer ...................... 156/345

Primary Examiner—Thi Dang
Attorney, Agent, or Firm—IP Group of Pillsbury Madison & Sutro LLP

[57] ABSTRACT

A gas injector for use in a semiconductor etching process including a plurality of injecting holes on the central portion thereof, for injecting process gases, a plurality of bolt holes formed on edges of the gas injector, facewise against a gas supply for securing the gas injector, a plurality of bolt head-accommodating slots formed on a first gas injecting face, for receiving the heads of the bolts, and a second gas injecting disposed plurality of bolt head accommodating slots on a face opposite to the first gas injecting face, whereby the gas injector can be successively installed each side down and thus, reused after the side first disposed towards the semiconductor workpieces has become too etched to provide the desired injection pattern.

1 Claim, 2 Drawing Sheets

GAS INJECTOR FOR USE IN SEMICONDUCTOR ETCHING PROCESS

FIELD OF THE INVENTION

The present invention relates to a gas injector for use in a semiconductor etching process, and more particularly to a gas injector of which the life expectancy is extended to double that of a conventional gas injector, the life expectancy of which is shortened due to etching of the injecting face of the gas injector.

Description of the Prior Art

Generally, in the etching step of a semiconductor manufacturing process, the uppermost of a wafer is selectively removed througn holes formed in a photoresist layer. FIG. 1 illustrates such a device for an etching process.

The etching process is carried out in a sealed chamber (not shown), and in order to carry out etching of a wafer 1, process gases such as $CF_4$, $CHF_3$, He, Ar are injected by the device. Further, in order to activate these process gases, a radio frequency (RF) is irradiated into the chamber, so that the wafer 1 is etched.

As shown in FIG. 1, a gas supplying device for supplying the process gases into the chamber includes: upper and lower tubes 2 and 3 for receiving the process gases from a gas source (not shown); and a gas injector 4 made of amorphous carbon, fixed to the lower tube 3, and having a plurality of injecting holes 4a for injecting the process gases into the chamber.

Further, the gas injector 4 is provided with a plurality of through holes 4c on the edges thereof, and through these through holes, the gas injector 4 and the lower tube 3 are fastened together by means of bolts.

Further, there are bolt head slots 4d on the injecting face 4b, so that the heads of the fastened bolts do not protrude beyond the injecting face.

Therefore, the process gases are supplied from the gas supply source through gas paths 2a and 3a of the upper and lower tubes 2 and 3 so as to be injected through the plurality of the injecting holes 4a of the gas injector 4. Here, a distance H between the surface of a wafer 1 to be etched and the injecting face 4b of the gas injector 4 should be accurately maintained, since the distance H is related to the etching depth of the wafer 1.

However, in the repeating etching processes, the injecting face 4b of the gas injector 4 is exposed to the etching atmosphere within the chamber, and therefore, the injecting face is etched by small amounts.

If the injecting face 4b is repeatedly used, as shown in FIG. 2, the injecting face 4b of the gas injector 4 is significantly etched, with the result that the distance H between the injecting face 4b and the surface of the wafer 1 is extended. Further, the etching contour becomes a curved surface, and therefore, the injecting hole 4a is enlarged.

FIG. 3A illustrates a wafer etching state in which the etching is carried out with a normal injecting distance. In this case, the distance (injecting distance) between the injecting face 4b of the gas injector 4 and the surface of the wafer 1 is normally maintained, and in this case, the conductive layer 1a is etched to the desired depth. However, if the injecting face 4b of the gas injector 4 is etched in use, thereby causing the injecting distance to become extended, the conductive layer 1a cannot thereafter be etched as much as desired, as shown in FIG. 3B.

Further, due to the etching of the injecting face 4b of the gas injector 4, if the injecting hole 4a is enlarged, then there occurs a variation in the injecting pressure. This affects the atmosphere of the chamber, with the result that the etching characteristics are adversely influenced.

As described above, in the conventional gas injector 4, the etching characteristics are aggravated due to the etching of the injecting face 4b, and therefore, the etching is not carried out as much as desired, with the result that the yield is decreased. Therefore, the gas injector has to be replaced as early as possible before the etching characteristics are aggravated, and therefore, the replacing becomes too frequent, thereby aggravating the economics of the process.

SUMMARY OF THE INVENTION

The present invention is intended to overcome the above-described disadvantages of the conventional technique.

Therefore, it is an object of the present invention to provide a gas injector for use in a semiconductor etching process, in which, after the injecting face of the gas injector used in a semiconductor etching process is etched to such a degree as to be unusable, the opposite face of the injecting face can be used, thereby doubling the life expectancy of the gas injector.

For achieving the above object, the gas injector according to the present invention includes: a plurality of injecting holes formed on the central portion of the gas injector, for injecting process gases; a plurality of bolt holes formed on edges of the gas injector, for fastening the gas injector; a plurality of bolt head-accommodating slots formed on the gas injecting face, for inserting the heads of the bolts, and the gas injector further includes a plurality of bolt head-accommodating slots on a face opposite to the gas injecting face, whereby the gas injector can be installed with either face outwards.

BRIEF DESCRIPTION OF THE DRAWINGS

The above object and other advantages of the present invention will become more apparent by describing in detail the preferred embodiment of the present invention with reference to the attached drawings, in which.

DESCRIPTION OF THE PREFERRED EMBODIMENT

Figure 1:
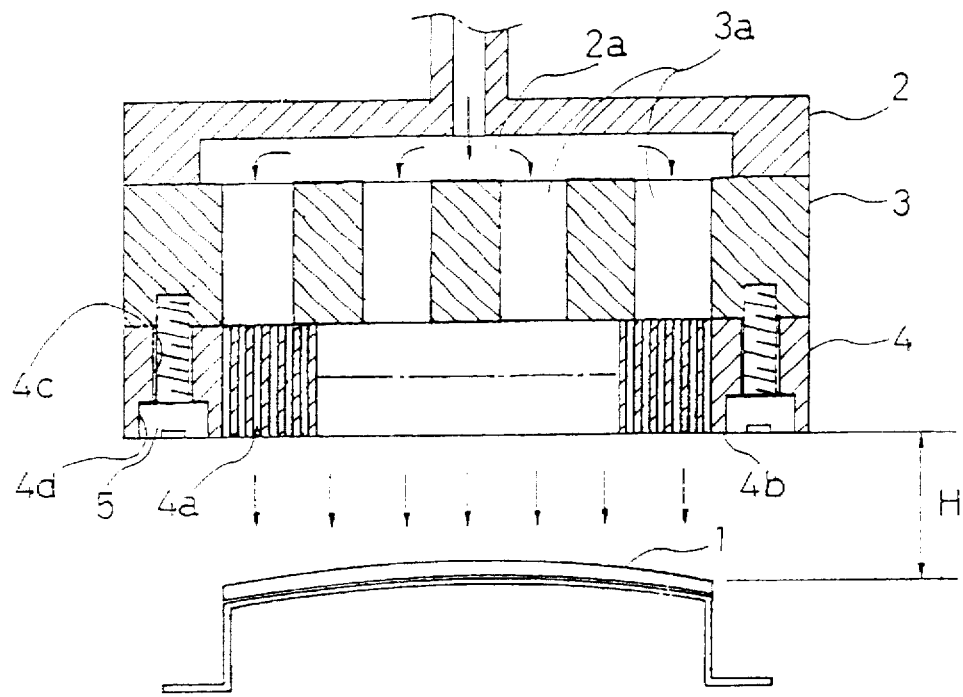
FIG. 1 is a schematic sectional view showing a semiconductor etching gas-supplying device with a conventional gas injector attached thereon.
Figure 2:
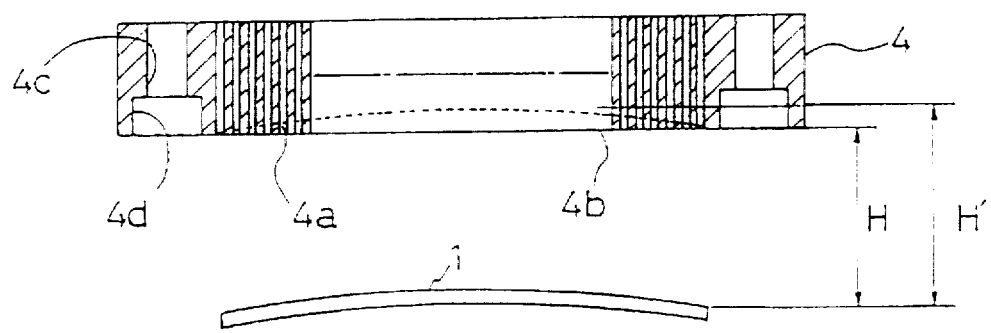
FIG. 2 is a sectional view showing an etched-off injecting face of the conventional gas injector.
Figure 3A:
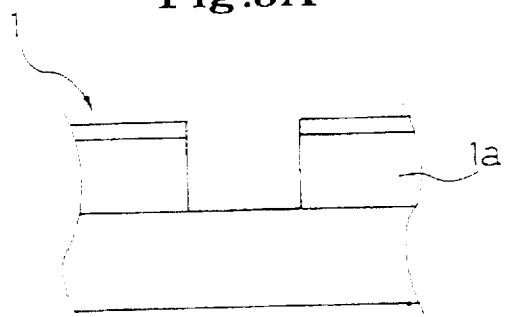
FIG. 3A is a sectional view of a wafer showing an etched state resulting from employing a normal etching process.
Figure 3B:
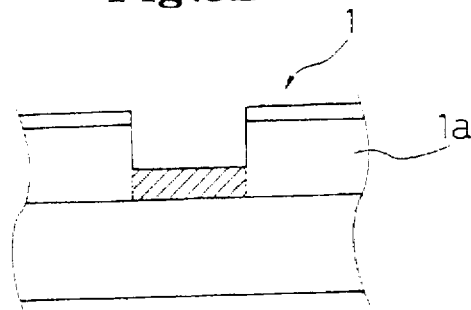
FIG. 3B is a sectional view of a wafer showing a defective etching state resulting from employing an abnormal etching process, using a conventional gas injector, which has become excessively etched.
Figure 4:
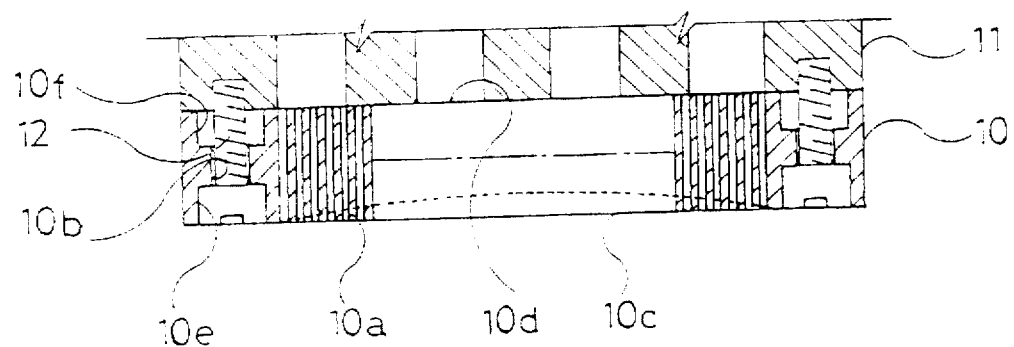
FIGS. 4 and 5 are sectional views showing an installation state of a gas injector according to the present invention before and after reversal following etching in use of a first face of the gas injector.
Figure 5:
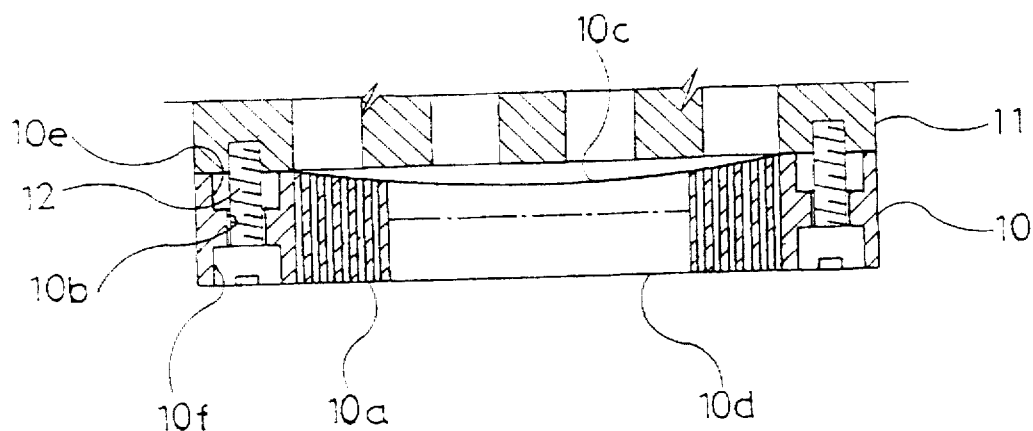

FIGS. 4 and 5 are sectional views showing an installation state of a gas injector 10 according to the present invention. The gas injector 10 is provided with a plurality of injecting holes 10a on the central portion thereof, for injecting process gases. Further, the gas injector 10 is provided with a plurality of through holes 10b on the edges thereof, for fastening the gas injector 10 to a gas-supplying device 11.

The gas injector 10 is fixed to the gas-supplying device 11 by means of bolts 12 by fastening the bolts 12 through the through holes 10b, in such a manner that an opposite face 10d from the injecting face 10c is contacted with the gas-supplying device 11. Further, each of the through holes 10b has a first bolt head-accommodating slot 10e on the side of the injecting face, for inserting the head of the bolt 12, so that the head of the bolt 12 does not protrude beyond the injecting face 10c after fastening of the bolt.

Further, the gas injector 10 according to the present invention is provided with a second bolt head-accommodating slot 10f on an opposite end of each of the through holes 10b. The second bolt head-accommodating slots 10f are on a face 10d opposite from the injecting face 10c. This is for reusing the gas injector 10 by rotating it through 180 degrees, so as to exchange it face for face, so as to contact the injecting face 10c instead of the face 10d to the gas supplying device 11.

As shown in FIG. 4, in the device of the present invention, while the gas injecting face 10c of the gas injector 10 is directed toward the inside of the chamber, the opposite face 10d is made to contact the gas-supplying device 11, and the gas injector 10 and gas-supplying device 11 are fastened to one another by means of the bolts 12 through the through holes 10b.

Under this condition, the heads of the bolts 12 are inserted into the first bolt head-accommodating solts 10e respectively, so that the heads of the bolts 12 do not protrude. Therefore, the gases supplied from the gas supplying device are injected through the plurality of the injecting holes 10a, thereby making it possible to carry out an etching.

Meanwhile, the injecting face 10c of the gas injector 10 is exposed to the etching atmosphere, and therefore if it is used for a long time, the injecting face 10c becomes etched, as shown by a dotted line in FIG. 4. Consequently, the gas-injecting distance down to the wafer is extended, and the injecting holes 10a are enlarged, with the result that the gas-injecting pressure is lowered. Therefore, etching defects are generated due to the variation of the etching atmosphere, and therefore, a new gas injector has to be provided in place of the existing one before the existing one has become so warn that such defects are generated.

In the present invention, the used gas injector 10 is itself reinstalled by turning it upside down relative to the gas-supplying device 11 without installing a completely new gas injector. Therefore, after this reinstallation, the injection is carried out as if a new gas injector has been installed.

That is, as shown in FIG. 5, the reinstalling process is carried out in the following manner. The gas injector 10 is detached from the gas-supplying device 11, then the etched injecting face 10c is attached to the gas-supplying device 11, and then, a fastening is a carried out by means of the bolts 12 through the through holes 10b. Under this condition, the heads of the bolts 12 are accommodated inside the second bolt head-accommodating slots 10f, and therefore, there is no protrusion of the heads of the bolts 12. The opposite face 10d has the same contour as the injecting face 10c had before the etching of the face 10c occured. Therefore, the face 10d is capable of carrying out injection in a normal manner. Meanwhile, the injecting face 10c which has been etched and put to the other side does not adversely affect the gas injection at all.

Therefore, the reinstallation gives the same effect as an installation of a new gas injector, with the result that the injecting pressure and the injecting distance down to the surface of the wafer can be maintained suitable to the etching characteristics required. Thus, a normal etching process can be carried out.

According to the present invention, as described above, the gas injector is made to inject the process gases from both faces, in succession and bolt head-accommodating slots are provided on both faces of the gas injector. Therfore, when one injecting face of the gas injector becomes too much etched, the gas injector is turned upside down and the so-inverted gas injector is reattached to the gas supplying device, so that process gases can be injected from the other injecting face. Consequently, the life expectancy of the gas injector is doubled, and some of the semiconductor manufacturing facility cost can be saved.

What is claimed is:

1. A gas injector for securement to a gas supply, for injecting a gas against a semiconductor workpiece, in a semiconductor etching process, said gas injector comprising:
- a body having two opposite faces;
- a plurality of gas-injecting holes formed through a central portion of said body so as to open through both of said faces at opposite ends thereof;
- a plurality of bolt holes formed through an outer peripheral portion of said body, peripherally of said central portion, so as to open through said body at opposite ends thereof;
- said body being recessed where each end of each bolt hole, for providing respective bolt head-accommodating slots in said body, so that said body can be successively secured to the gas supply by bolts with one said face, and with the other said face thereof disposed against the gas supply, and heads of the bolts recessed into respective ones of the bolt head-accommodating slots.

* * * * *